United States Patent
Kautz et al.

(10) Patent No.: US 6,571,453 B1
(45) Date of Patent: Jun. 3, 2003

(54) METHOD FOR PRODUCING A SUPERCONDUCTOR, IN STRIP FORM, HAVING A HIGH-$T_C$ SUPERCONDUCTOR MATERIAL

(75) Inventors: Stefan Kautz, Rückersdorf (DE); Bernhard Fischer, Bruchköbel (DE); Bernhard Roas, Heidenheim (DE); Manfred Kühnl, Heroldsbach (DE)

(73) Assignee: Siemens Aktiengesellschaft, Munich (DE)

( * ) Notice: Subject to any disclaimer, the term of this patent is extended or adjusted under 35 U.S.C. 154(b) by 135 days.

(21) Appl. No.: 09/591,456

(22) Filed: Jun. 9, 2000

Related U.S. Application Data

(63) Continuation of application No. PCT/DE98/03554, filed on Dec. 2, 1998.

(30) Foreign Application Priority Data

Dec. 9, 1997 (DE) .......................................... 197 54 669

(51) Int. Cl.⁷ ............................................. H01L 39/24
(52) U.S. Cl. ...................... 29/599; 174/125.1; 505/431; 505/433; 505/928
(58) Field of Search .......................... 29/599; 505/431, 505/433, 928; 174/125.1

(56) References Cited

U.S. PATENT DOCUMENTS

| | | | |
|---|---|---|---|
| 3,325,888 A | * | 6/1967 | Weinig et al. |
| 5,208,215 A | | 5/1993 | Chen et al. |
| 5,246,917 A | | 9/1993 | Hikata et al. |
| 5,399,312 A | | 3/1995 | Liu et al. |
| 5,885,938 A | * | 3/1999 | Otto et al. ................... 29/599 |
| 6,311,384 B1 | * | 11/2001 | Mukai |

FOREIGN PATENT DOCUMENTS

| | | |
|---|---|---|
| DE | 44 44 937 A1 | 6/1998 |
| EP | 0 281 444 A1 | 9/1988 |
| EP | 0 435 286 A1 | 7/1991 |

OTHER PUBLICATIONS

"Critical current density of rolled silver–sheathed Bi(2223) tapes" (Utsunomiya et al.), dated 1995, Physica C, vol. 250, pp. 340–348, as mentioned on p. 2 of the specification.

"Bi–2223 Multifilament Tapes and Multistrand Conductors for HTS Power Transmission Cables" (Leghissa et al.), dated Jun. 1997, IEEE Transactions on Applied Superconductivity, vol. 7, No. 2, pp. 355–358.

* cited by examiner

*Primary Examiner*—Carl J. Arbes
(74) *Attorney, Agent, or Firm*—Laurence A. Greenberg; Werner H. Stemer; Ralph E. Locher

(57) ABSTRACT

A method for producing a high-$T_c$ superconductor having a strip shape and having at least one superconductive conductor core by forming a conductor initial product and annealing. The forming is in this case intended to include at least two flattening steps. A flattening step which follows a preceding flattening step is intended to result in the percentage thickness reduction in the cross section of the at least one conductor core being greater than that from the preceding flattening step. The strip conductor produced in this way advantageously has a plurality of conductor cores that are embedded in a Ag material and are composed of a bi-cuprate.

10 Claims, 1 Drawing Sheet

METHOD FOR PRODUCING A SUPERCONDUCTOR, IN STRIP FORM, HAVING A HIGH-$T_C$ SUPERCONDUCTOR MATERIAL

CROSS-REFERENCE TO RELATED APPLICATION

This is a continuation of copending International Application PCT/DE98/03554, filed Dec. 2, 1998, which designated the United States.

BACKGROUND OF THE INVENTION

Field of the Invention

The invention relates to a method for the production of an elongated superconductor, in strip form that has at least one conductor core. The superconductor is formed of a superconductor material with a metal-oxide high-$T_c$ phase and is surrounded by a normally conductive material. In which method, a conductor initial product is produced from a powdery initial material of the superconductor material surrounded by the normally conductive material. The conductor initial product is then subjected to a plurality of forming steps which reduce the cross section, compress the initial material and contain at least two flattening steps, and to at least one annealing process. The invention also relates to a superconductor produced using this method. An appropriate production method and a superconductor produced using this method are disclosed, for example, in the publication "Physica C", Vol. 250, 1995, pages 340 to 348.

Superconductive metal-oxide compounds having high critical temperatures $T_c$ of more than 77 K are known, which are therefore also referred to as high-$T_c$ superconductor materials or HTS materials and, in particular, allow a liquid-nitrogen ($LN_2$) cooling technique to be used. Such metal-oxide compounds include, in particular, cuprates of specific material systems, in particular such as the base type Y—Ba—Cu—O which contains rare earths, or the base type Bi—Sr—Ca—Cu—O or (Bi, Pb)—Sr—Ca—Cu—O, which do not contain any rare earths. A number of superconductive high-$T_c$ phases may occur within individual material systems such as the bi-cuprates, which differ in the number of copper-oxygen network levels or layers within the crystalline unit cells, and in the various critical temperatures $T_c$.

Attempts have been made to use the known HTS materials to produce elongated superconductors in wire or strip form. One method that is regarded as being suitable for this purpose is the so-called "powder-in-tube technique", which is known in principle from the production of superconductors using the classic metallic superconductor material $Nb_3Sn$. In this technique, a generally powdery initial material which is composed of the HTS material but in general does not yet possess the desired superconductive high-$T_c$ phase, or possesses it only to a minor extent, is introduced into a tubular sheath or into a matrix composed of a normally conductive material, in particular composed of Ag or an Ag alloy, in order to produce conductors composed of HTS material as well. The conductor initial product which be obtained in this way is then changed to the desired final dimension by forming processes which, if required, can be interrupted by at least one heat treatment process at an increased temperature. After this, the conductor intermediate product obtained in this way is subjected to at least one annealing process in order to set or optimize its superconductive characteristics and to form the desired high-$T_c$ phase, which annealing process may be interrupted, if required, by a further forming step.

If appropriate high-$T_c$ superconductors or their conductor initial products or their conductor intermediate products are grouped in a manner known per se, then it is also possible to obtain conductors having a plurality of superconductive conductor cores, so-called multicore or multifilament superconductors.

The known single-core or multicore superconductors using the HTS material are preferably in strip form. In order to obtain a corresponding conductor end product with this form, the literature reference mentioned initially states that a rolling process must be provided. However, before this rolling process, a generally cylindrical, preformed and precompressed composite body must be produced from the conductor initial product, whose conductor cores are generally disposed distributed uniformly, when seen over the cross section. This composite body, which is referred to in the following text as a raw conductor, is then changed to the flat strip form by a rolling process. The rolling process includes a plurality of rolling steps, in order in this way to achieve a texture required for a high current carrying capacity, that is to say with the crystal layers of the superconductive phase being aligned largely parallel. To do this, the initial material of the superconductor must be compressed as much as possible by the rolling process during the forming of the raw conductor. However, it has been found that, beyond a certain powder density, further forming results in inhomogeneities such as the so-called "sausaging", that is to say the conductor core being constricted or reduced along the length of the conductor, or cracks occurring. This limits the amount of compression from the rolling process.

For this reason, the method that is disclosed in the literature reference mentioned initially allows compression to be carried out only until corresponding inhomogeneities occur. Thus, as a rule, the rolling process is carried out so as to ensure that, after the first rolling step, the next rolling step results in an at least largely equivalent reduction in the thickness of the individual conductor core, or percentage thickness reduction. The term thickness reduction in this case relates to the parameter $(d_i-d_{i+1})/d_i$, where the index $i=0, 1, 2 \ldots$ refers to the number of the respective rolling step, and $d_i$ refers to the thickness of the respective conductor core after the i-th rolling step. $d_0$ is the initial thickness, before rolling.

In the method for production of an HTS strip conductor that is disclosed in Published, European Patent Application EP 0 435 286 A, the rolling process is carried out such that the thickness reduction in a second rolling step which follows the first rolling step is less than that from the preceding step.

SUMMARY OF THE INVENTION

It is accordingly an object of the invention to provide a method for producing a superconductor, in strip form, having a high-$t_c$ superconductor material that overcomes the above-mentioned disadvantages of the prior art methods of this general type, in which inhomogeneity problems are reduced, thus resulting in a superconductor, in strip form, having an increased current carrying capacity.

With the foregoing and other objects in view there is provided, in accordance with the invention, a production method, which includes:

producing a conductor initial product having a plurality of conductor cores formed of a powdery initial material being a superconductor material and surrounded by a normally conductive material;

subjecting the conductor initial product to a first flattening step such that a percentage reduction in a thickness of a cross section of at least one conductor core is between 3 and 10% and powder fluidity is maintained in the at least one conductor core;

subsequently subjecting the conductor initial product to a second flattening step carried out such that the percentage reduction in the thickness of the cross section of the at least one conductor core is at least 5% greater than that from the first flattening step; and annealing the conductor initial product resulting in an elongated superconductor having the plurality of conductor cores composed of the superconductor material with a metal-oxide high-Tc phase and being in a strip form.

The object is achieved according to the invention in that a flattening step which follows a preceding flattening step can be carried out in such a way that the percentage reduction in the thickness of the cross section of the at least one conductor core resulting from the subsequent flattening step is greater than that from the preceding flattening step.

The measures according to the invention thus result in progressive compression of the powdery initial material. That is to say the percentage thickness reduction of the at least one conductor core increases during the raw conductor forming process. In this case, the term raw conductor refers to the composite body before the first flattening step, in particular by rolling. The procedure is based on the fact that the powder fluidity during the raw conductor forming process must be maintained for as long as possible, in order in this way to achieve optimum compression of the powder. Specifically, if all the rolling steps produce a constantly low forming level of, for example, 10%, then the powdery initial material will reach a virtually solidified state after a small number of rolling steps. Therefore, the powder particles can no longer move owing to the friction between them, since the externally applied force is no longer sufficient to overcome the friction forces. This prevents the powder from flowing; the powder particles are now only pressed against one another, as a result of which cavities remain, and the compression process stagnates. If the amount of forming is constantly high, the powder will be compressed so severely just in the first step that inhomogeneities such as cracks or fractures will occur if further forming is carried out. This results in that the powder is then no longer fluid. Degressive compression as is intended to be provided, for example, in the cited Published, European Patent Application EP 0 435 286 A, and in which only lesser forming levels follow a high forming level results in that the compression process resulting from powder fluidity comes to end even after the first rolling step.

In contrast, the measures according to the invention achieve progressive compression, or forming. Increasing the forming force thus makes it possible to overcome the previously blocked state of the powder, due to friction, which can lead to further fluidity and compression. The powder fluidity can thus be maintained for as long as possible as the forming level increases and the density rises. This prevents high partial compression processes and microscopic fractures, which lead to the above-mentioned inhomogeneities, before the conductor end product reaches the desired density.

The advantages achieved by the measures according to the invention are thus that deliberate selection of the compression parameters results in that inhomogeneities cannot occur until considerably high powder densities thus, by virtue of the increased homogeneous powder densities, making it possible to ensure a correspondingly greater current carrying capacity.

The method according to the invention is used particularly advantageously for production of a single-core superconductor, or preferably a multicore superconductor, whose at least one conductor core is surrounded by a normally conductive material which contains Ag or is composed of Ag. This makes it easier to form the superconductive phase in an atmosphere containing oxygen.

In accordance with an added feature of the invention, there is the step of subjecting the elongated superconductor having the strip form to at least one more further flattening step.

In accordance with an additional feature of the invention, there is the step of performing the first flattening step and the second flattening step as rolling steps.

In accordance with another feature of the invention, there is the step of carrying out the rolling steps with pairs of rollers having differing roller diameters.

In accordance with another added feature of the invention, there is the step of performing the second flattening step such that the percentage reduction in the thickness of the cross section is at least 20% greater than that from the first flattening step.

In accordance with another additional feature of the invention, there is the step of performing the at least one more further flattening step such that the percentage reduction in the thickness of the cross section is at least 20% greater than that from the first flattening step.

In accordance with yet another feature of the invention, there is the step of producing the conductor initial product using a powder-in-tube technique and further processing the conductor initial product with at least one forming step which reduces the cross section, to form a raw conductor which is subsequently subjected to the first flattening step.

In accordance with a further added feature of the invention, there is the step of providing a material containing at least Ag as the normally conductive material.

In accordance with a further additional feature of the invention, there is the step of forming the plurality of conductor cores formed with the high-$T_c$ phase to be composed of a superconductive bi-cuprate.

In accordance with a concomitant feature of the invention, there is the step of subjecting the elongated superconductor to at least one further annealing process step.

Other features which are considered as characteristic for the invention are set forth in the appended claims.

Although the invention is illustrated and described herein as embodied in a method for producing a superconductor, in strip form, having a high-$t_c$ superconductor material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DESCRIPTION OF THE PREFERRED EMBODIMENTS

Figure 1:
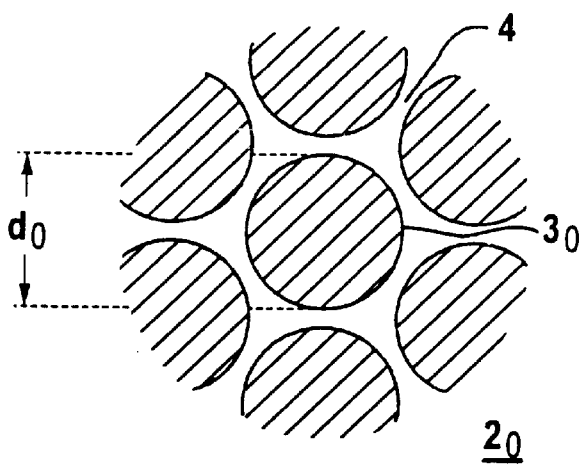
FIG. 1 is a diagrammatic, sectional view of a conductor core of a raw conductor before being flattened according to the invention.

A superconductor produced according to the invention, and referred to in the following text as a conductor end product, has an elongated composite body in strip form which contains a high-$T_c$ (HTS) superconductor material, with at least a high level of phase purity, embedded in a normally conductive matrix material. Virtually any known high-$T_c$ superconductor materials are suitable for use as the HTS material, preferably cuprates which have no rare earths, with phases whose critical temperature $T_c$ is above the vaporization temperature of liquid nitrogen ($LN_2$) of 77 K. One appropriate example is the HTS material of the (Bi, Pb)$_2$Sr$_2$Ca$_2$Cu$_3$O, type, which is assumed as an exemplary embodiment in the following text. A powder-in-tube technique, which is known per se, can be used as the basis for production of an appropriate HTS conductor composed of this bi-cuprate (see, for example, Published, Non-Prosecuted German Patent Application DE 44 44 937 A). To this end, a powdery initial product material, which allows the desired superconductive phase to be formed, or the already formed superconductive material is introduced into an outer tube, whose material is used as the matrix material for the final superconductor end product. The outer tube is preferably composed of a base material which is not subject to any undesirable reaction with the components of the HTS material, such as with oxygen, during production of the conductor, and which is easy to form. An Ag material is thus particularly suitable for use as the base material, containing either Ag in pure form, or in the form of an alloy with Ag as the main component (that is to say representing more than 50% by weight). For example, it is possible to use pure Ag in the form of cold work-hardened silver or recrystallized silver. It is also possible to provide silver produced by powder-metallurgical techniques. In addition, dispersion-hardened silver is also suitable.

The structure containing the outer tube and the core surrounded by it and composed, for example, of the initial product material for the HTS material may then be subjected to a sequence of a plurality of forming steps which, in particular, reduce the cross section, in order to obtain a raw conductor. Any known methods such as extrusion, drop-forging, hammering, drawing or rolling may be used for the forming steps (see, for example, Published, European Patent Application EP 0 281 444 A) and may also be combined with one another. These mechanical processes may be carried out either at room temperature or else at an increased temperature or even, if required, at low temperature. These forming steps then result in a raw conductor in the form of a composite body having a cross-sectional surface which is generally circular but which, if required, may also be rectangular. The composite body is then also subjected to a flattening process containing a plurality of steps, in order in this way to obtain a strip form that at least largely corresponds to the desired end product. Furthermore, at least one heat-treatment or annealing process must also be carried out, which is generally carried out at the end of the flattening process, preferably in an atmosphere such as air containing oxygen, in order in this way to provide the initial product material in a manner known per se with the oxygen required to form the desired superconductive phase, or to ensure that this phase is produced once again.

The method described above may not only be used for production of single-core conductors, but is also particularly suitable for production of multicore conductors. Such multicore or multifilament conductors are generally formed by use of a bundling technique, which is known per se. In this technique, it is possible, for example, to form a bundle from a plurality of initial products, which each contain an outer tube and a core (located inside it) composed of the initial product material, in a larger outer tube composed of the matrix material. Preformed and, if required, pre-annealed raw conductors or other conductor intermediate products may, of course, also be introduced into such an outer tube. The structure obtained in this way is then processed further in an analogous way to a single-core conductor.

The raw conductor, which contains one or preferably a plurality of conductor cores, is then subjected to a flattening process, for example by drawing, pressing, hammering or, in particular by rolling, in order to obtain the desired strip form in this way. The rolling process that is then carried out is in this case intended to contain at least two rolling steps. According to the invention, the flattening step which follows a preceding (in particular first) flattening step (preferably a rolling step) can be carried out in such a way that the percentage thickness reduction in the cross section of the at least one conductor core resulting from the subsequent (in particular second) flattening step (preferably rolling step) is greater than that from the preceding flattening step.

Figure 2:
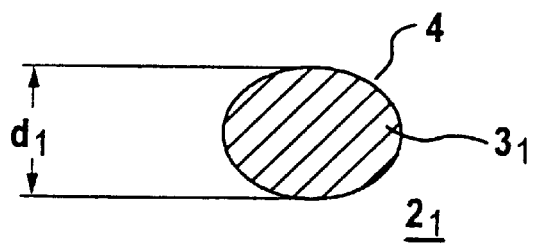
FIG. 2 is a sectional view of the conductor core after a first flattening step.
Figure 3:
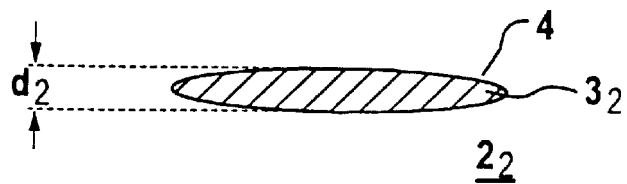
FIG. 3 is a sectional view of the conductor core after a second flattening step.

Referring now to the figures of the drawing in detail and first, particularly, to FIG. 1 thereof, there is shown how corresponding progressive forming takes place. The description assumes a raw conductor $2_0$ having at least one conductor core $3_0$ of a diameter or thickness $d_0$. The conductor core $3_0$ is in this case assumed to be surrounded by a normally conductive material 4. The raw conductor $2_0$ is then flattened by a first rolling step to form a raw conductor $2_1$, with a flattened conductor core, which is now denoted by $3_1$, having a thickness $d_1$ (see FIG. 2). This is then followed by a second rolling step, in order to change the flattened raw conductor $2_1$ into an even flatter raw conductor $2_2$. Its conductor core $3_2$ then has a thickness $d_2$ (see FIG. 3). This may be followed by further rolling steps, at the end of which a composite body in strip form is produced, which is also subjected to at least one annealing process. Progressive forming need not necessarily be carried out in all the further rolling steps, or in some of these rolling steps. However, it is always advantageous for the progressive forming process to be carried out preferably at least at the start of the entire rolling process, rather than only at its end. According to the invention, this progressive forming process can be described by the following inequality:

$$\frac{d_0 - d_1}{d_0} < \frac{d_1 - d_2}{d_1}$$

Therefore, after the first rolling step, at least one of the subsequent rolling steps, preferably the next, is intended to produce a greater thickness reduction. The subsequent rolling step advantageously produces a thickness reduction that is at least 5% greater. The increase in the thickness reduction between the first rolling step and the subsequent rolling step, or one of the subsequent rolling steps, should preferably be at least 20%. Furthermore a relatively small thickness reduction is expediently planned to occur at the start of the rolling process. In general, this thickness reduction is between 3 and 10%.

According to one specific exemplary embodiment, an Ag/Bi-2223 strip conductor having 55 conductor cores was produced, whose conductor cross section largely corresponded to that of a known strip conductor (see "IEEE Trans. Appl. Supercond.", Vol. 7, No. 2, June 1997, pages 355 to 358). According to the invention, progressively increasing raw conductor forming was carried out by a plurality of rolling steps for this purpose. The successive thickness reduction measured in the strip thickness of an approximately central conductor core was, in this case, in detail:

$$d_1 = 0.95 \times d_0,$$

$$d_2 = 0.85 \times d_0,$$

$$d_3 = 0.7 \times d_0,$$

$$d_4 = 0.5 \times d_0.$$

The conductor end product then had a critical current density of more than 50 kA/cm$^2$.

In the exemplary embodiment explained above, it has been assumed that the flattening process includes at least two rolling steps. Other known flattening methods such as hammering, pressing, forging or drawing may, of course, also be used instead of rolling. The individual rolling steps may also be carried out by pairs of rollers whose roller diameters differ.

We claim:

1. A production method, which comprises:
producing a conductor initial product having a plurality of conductor cores formed of a powdery initial material being a superconductor material and surrounded by a normally conductive material;
subjecting the conductor initial product to a first flattening step such that a percentage reduction in a thickness of a cross section of at least one conductor core is between 3 and 10% and powder fluidity is maintained in the at least one conductor core;
subsequently subjecting the conductor initial product to a second flattening step carried out such that the percentage reduction in the thickness of the cross section of the at least one conductor core is at least 5% greater than that from the first flattening step; and
annealing the conductor initial product resulting in an elongated superconductor having the plurality of conductor cores composed of the superconductor material with a metal-oxide high-Tc phase and being in a strip form.

2. The method according to claim 1, which comprises subjecting the elongated superconductor having the strip form to at least one more further flattening step.

3. The method according to claim 1, which comprises performing the first flattening step and the second flattening step as rolling steps.

4. The method according to claim 3, which comprises carrying out the rolling steps with pairs of rollers having differing roller diameters.

5. The method according to claim 1, which comprises performing the second flattening step such that the percentage reduction in the thickness of the cross section is at least 20% greater than that from the first flattening step.

6. The method according to claim 2, which comprises performing the at least one more further flattening step such that the percentage reduction in the thickness of the cross section is at least 20% greater than that from the first flattening step.

7. The method according to claim 1, which comprises producing the conductor initial product using a powder-in-tube technique and further processing the conductor initial product with at least one forming step which reduces the cross section, to form a raw conductor which is subsequently subjected to the first flattening step.

8. The method according to claim 1, which comprises providing a material containing at least Ag as the normally conductive material.

9. The method according to claim 1, which comprises forming the plurality of conductor cores formed with the high-$T_c$ phase to be composed of a superconductive bi-cuprate.

10. The method according to claim 1, which comprises subjecting the elongated superconductor to at least one further annealing process step.

* * * * *